(12) United States Patent
Wang

(10) Patent No.: US 7,936,029 B2
(45) Date of Patent: May 3, 2011

(54) HALL EFFECT ELEMENT HAVING A HALL PLATE WITH A PERIMETER HAVING INDENTED REGIONS

(75) Inventor: Yigong Wang, Rutland, MA (US)

(73) Assignee: Allegro Microsystems, Inc., Worcester, MA (US)

( * ) Notice: Subject to any disclaimer, the term of this patent is extended or adjusted under 35 U.S.C. 154(b) by 263 days.

(21) Appl. No.: 12/388,866

(22) Filed: Feb. 19, 2009

(65) Prior Publication Data

US 2010/0207222 A1   Aug. 19, 2010

(51) Int. Cl.
*H01L 29/82* (2006.01)

(52) U.S. Cl. ......... 257/421; 257/E43.002; 257/E43.007; 257/E27.005

(58) Field of Classification Search .................. None
See application file for complete search history.

(56) References Cited

U.S. PATENT DOCUMENTS

| | | | |
|---|---|---|---|
| 5,652,445 A * | 7/1997 | Johnson | 257/295 |
| 2006/0011999 A1 | 1/2006 | Schott et al. | |
| 2006/0108654 A1 * | 5/2006 | Mueller | 257/421 |

* cited by examiner

*Primary Examiner* — Alonzo Chambliss
(74) *Attorney, Agent, or Firm* — Daly, Crowley, Mofford & Durkee, LLP

(57) ABSTRACT

A Hall effect element includes a Hall plate with an outer perimeter. The outer perimeter includes four corner regions, each tangential to two sides of a square outer boundary associated with the Hall plate, and each extending along two sides of the square outer boundary by a corner extent. The outer perimeter also includes four indented regions. Each one of the four indented regions deviates inward toward a center of the Hall plate. The Hall plate further includes a square core region centered with and smaller than the square outer boundary. A portion of each one of the four indented regions is tangential to a respective side of the square core region. Each side of the square core region has a length greater than twice the corner extent and less than a length of each side of the square outer boundary.

19 Claims, 5 Drawing Sheets

HALL EFFECT ELEMENT HAVING A HALL PLATE WITH A PERIMETER HAVING INDENTED REGIONS

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to Hall effect magnetic field sensing elements and, more particularly, to a Hall effect element having a Hall plate with a perimeter having a shape selected to improve performance of the Hall effect element.

BACKGROUND OF THE INVENTION

Hall effect magnetic field sensing elements are known. As is known, a Hall effect element includes a so-called "Hall plate," which is an epi region (i.e., layer) upon a substrate. An epi region will be understood to have a medium amount of doping, described more fully below. Above the epi region is a field plate having generally the same outline or perimeter as the Hall plate. The field plate is made of metal or polysilicon. Between the Hall plate and the field plate is disposed an isolation layer, for example, a field oxide or a nitride layer.

Referring to FIG. 1, a conventional square Hall effect element 10 has a square perimeter 14. A cross section of the Hall effect element 10 will be understood by those of ordinary skill in the art, but is the same as or similar to a cross section shown in FIG. 4.

The conventional square Hall effect element 10 has four contacts 12a-12d. As is known, in operation, a voltage is applied to opposite contacts, e.g., 12a and 12c, and an output voltage proportional to a magnetic field experienced by the Hall effect element 10 is generated between the other opposite contacts, e.g., 12b and 12d.

The perimeter 14 is representative of both a perimeter of the Hall plate, i.e., epi region, and also a perimeter of the field plate. A boundary 16 is representative of a field oxide extension beyond the edge of the perimeter 14.

Referring now to FIG. 2, a conventional cross-shaped Hall effect element 20 has a cross-shaped perimeter 22. It will be apparent that a conventional cross-shaped perimeter 22 has particular shape characteristics. For example, the perimeter 22 has four indented regions of which an indented region 28 is but one example. Taking the indented region 28 as representative of all of the indented regions, the indented region 28 has two sides 30, 32 forming a V-shape. An angle 34 between the two sides 30, 32 is ninety degrees. The cross-shaped perimeter 22 also has four corner regions, for example, a corner region 24 comprising two sides 24a, 24b, each side with a length 26. The cross-shaped perimeter 22 also has a square central core region 36. Lengths of the sides of the central core region 36, represented by a dimension 38 are each twice a length 26 of either of the sides 24a, 24b.

The conventional cross-shaped Hall effect element 20 has four contacts 38a-38d. Operation of the Hall effect element 20 is the same as or similar to operation of the Hall effect element 10 of FIG. 1.

In general, the cross-shaped Hall effect element 20 has certain advantages when compared with the square Hall effect element 10 of FIG. 1. In particular, the cross-shaped Hall effect element 20 of similar size to the square Hall effect element 10 uses less area than the square Hall effect element 10 of FIG. 1. Less area can result in higher device yield and also a smaller die on which the Hall effect element 20 is disposed, particularly when combined with other component on the same substrate. Less area also tends to result in lower capacitance, which tends to reduce response time.

In contrast, the square Hall effect element 10 of FIG. 1 has certain advantages when compared with the cross-shaped Hall effect element 20. In particular, the square Hall effect element 10 of similar size to the cross-shaped Hall effect element 20 has both higher sensitivity to magnetic fields and also lower resistance.

It would be desirable to have a Hall effect element that has all of the above-listed advantages, namely, a smaller area than a square Hall effect element, good sensitivity and low resistance like a square Hall effect element, with low capacitance and fast response time like the cross-shaped Hall effect element.

SUMMARY OF THE INVENTION

The present invention provides a Hall effect element having a shape selected to result in a smaller area than a square Hall effect element, while retaining good sensitivity and low resistance like a square Hall effect element.

In accordance with one aspect of the present invention, a Hall effect element includes a Hall plate comprised of epi material. The Hall plate includes a major planar surface comprising an outer perimeter. The outer perimeter includes four corner regions, each having two sides tangential to two respective sides of a square outer boundary associated with the Hall plate, each extending along two sides of the square outer boundary by a corner extent. The outer perimeter also includes four indented regions proximate to the four corner regions. Each one of the four indented regions deviates inward toward a center of the Hall plate. The Hall plate also includes a square core region centered with and smaller than the square outer boundary associated with the Hall plate. The square core region is entirely within the major planar surface of the Hall plate. A portion of each one of the four indented regions is tangential to a respective side of the square core region. Each side of the square core region has a length greater than twice the corner extent and less than a length of each side of the square outer boundary.

With this arrangement, the Hall effect element is neither a square Hall effect element nor a cross-shaped Hall effect element.

BRIEF DESCRIPTION OF THE DRAWINGS

The foregoing features of the invention, as well as the invention itself may be more fully understood from the following detailed description of the drawings, in which.

DETAILED DESCRIPTION OF THE INVENTION

Figure 3:
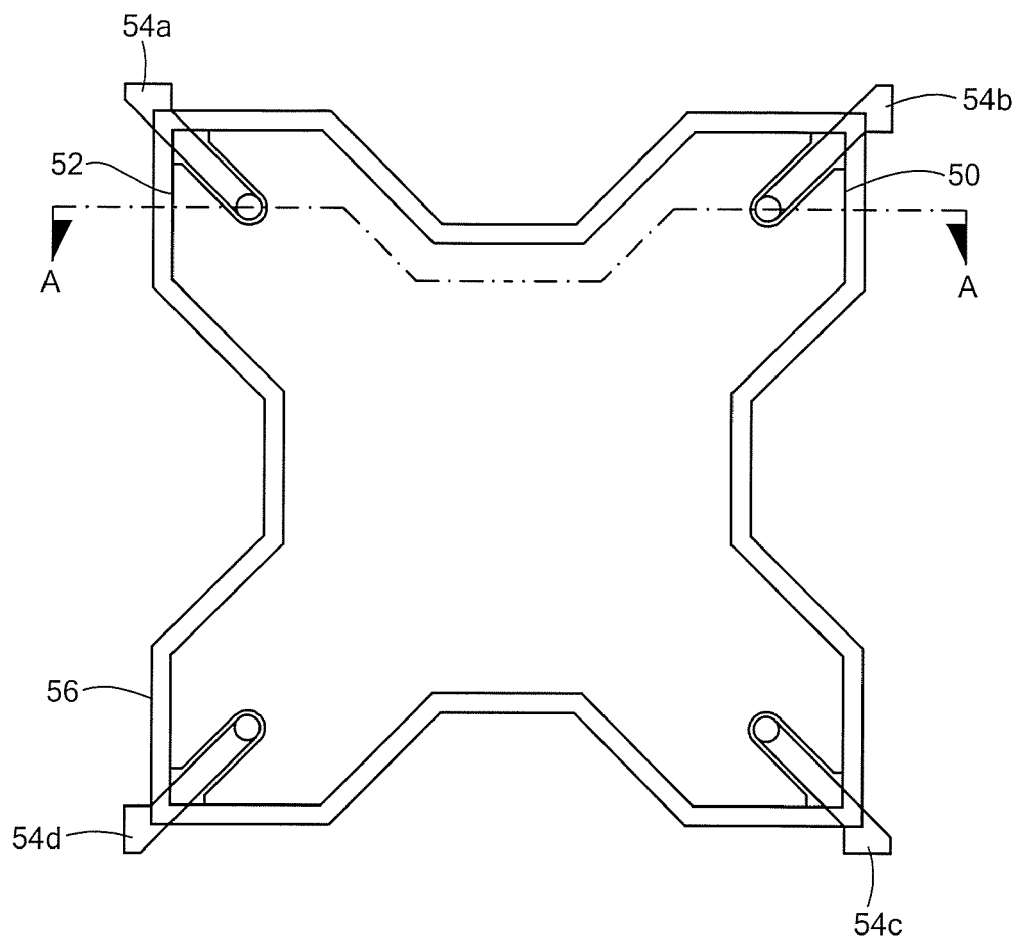
FIG. 3 is top view of a Hall effect element in accordance with the present invention and showing particular features.

Referring now to FIG. 3, an exemplary Hall effect element 50 has a perimeter 52 and four electrical contacts 54a-54d. The perimeter 52 has particular regions and characteristics described more fully below in conjunction with FIGS. 3A and 3B.

As will become apparent from discussion below in conjunction with FIG. 4, in a top view, a field plate of the Hall effect element 50 is visible. Therefore, the perimeter 52 can be the perimeter of the field plate. However, a Hall plate (also referred to herein as an epi region) disposed below the field plate can also have a perimeter with substantially the same shape as the shape of the perimeter 52. Therefore, the entire Hall effect element 50 can have the perimeter 52 and the features described below in conjunction with FIGS. 3A and 3B can apply to both the perimeter of the field plate and to the perimeter of the Hall plate (epi region).

However in other embodiments, a perimeter of the field plate can have a shape different than that of the perimeter of the Hall plate. For those embodiments, it is the perimeter of the Hall plate, i.e., epi region, that has the features described above and also below in conjunction with FIGS. 3-3B, and the field plate can have a perimeter with a different shape. Nevertheless, in FIGS. 3-3B, the features are described to be associated with a perimeter of a Hall effect element 50 for clarity. It should be understood that the Hall plate of the Hall effect element 50 has the indicated shape features, and the field plate may or may not have the same features.

In some embodiments, the Hall effect element 50 can be fabricated on an n-type silicon substrate (not shown), known to have higher mobility than a p-type substrate and known to result in a higher sensitivity Hall effect element.

The perimeter 52 is representative of both a perimeter of the Hall plate, i.e., epi region, and also a perimeter of the field plate. A boundary 56 is representative of a field oxide extension beyond the edge of the perimeter 14.

Figure 3A:
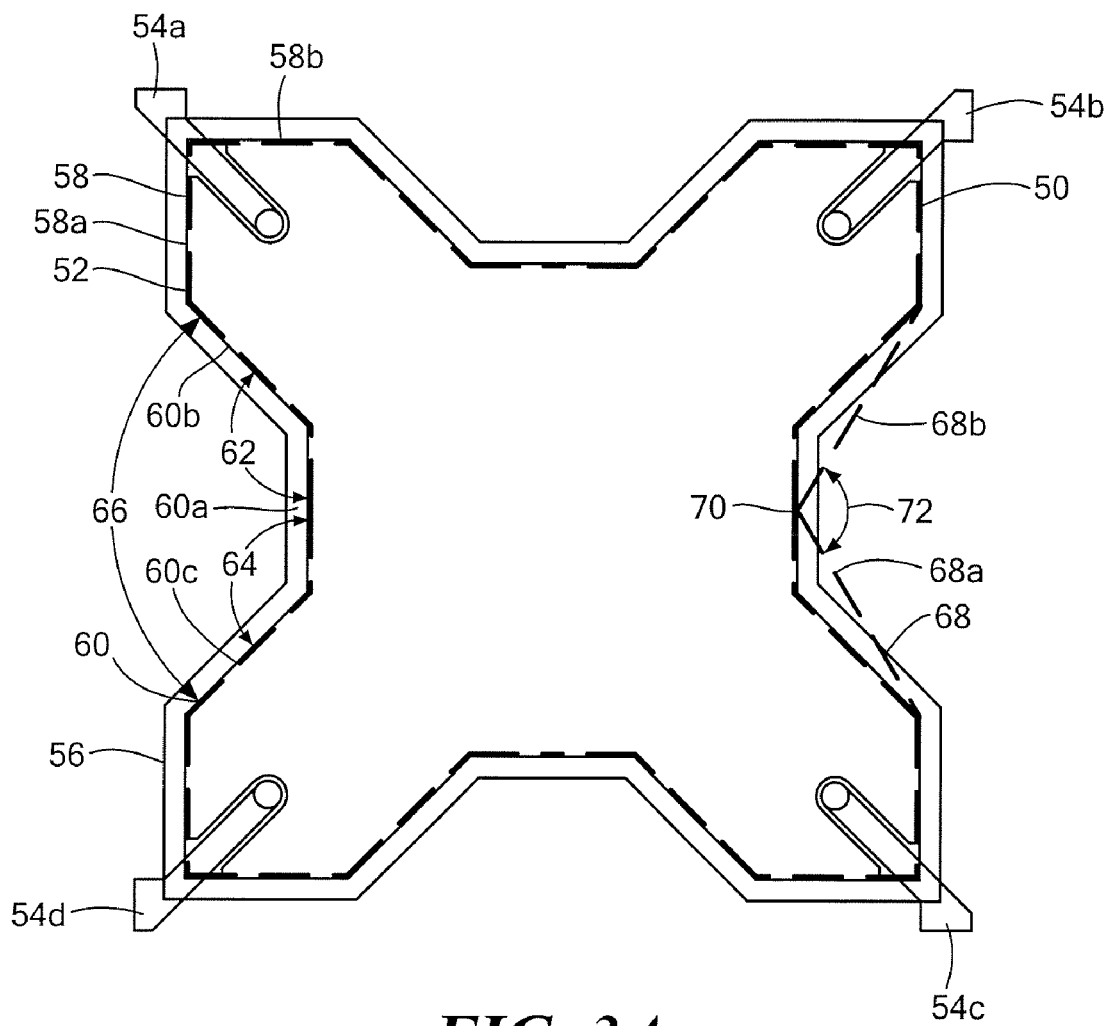
FIG. 3A is top view of the Hall effect element of FIG. 3 showing other particular features.

Referring to FIG. 3A, in which like elements of FIG. 3 are shown having like reference designations, the perimeter 52 of the Hall effect element 50 (or more precisely, the Hall plate, i.e., epi region, of the Hall effect element 50 for reasons described above in conjunction with FIG. 3) includes four corner regions, of which a corner region 58 is representative. Taking the corner region 58 as representative of the other corner regions, the corner region 58 has two sides 58a, 58b, shown having dashed lines with short dashes, forming a corner.

The perimeter 52 of the Hall effect element 50 also has four indented regions, of which an indented region 60 is but one example, proximate to the four corner regions. The indented regions deviate inward toward a center of the Hall effect element 50. Taking the indented region 60 as representative of the other indented regions, the indented region 60 includes a first side 60a and also second and third sides 60b, 60c, respectively, shown having dashed lines with long dashes. The second and third sides 60b, 60c can form obtuse angles 62, 64, respectively, with the first side 60a. In some embodiments, an angle 66 between the second and third sides 60b, 60c is about ninety degrees.

In some alternate arrangements, one or more of the indented regions can have only two sides. For example, an alternate indented region 68 has two sides 68a, 68b that intersect at a vertex 70. In some embodiments, an angle 72 between the two sides 68a, 68b is greater than ninety degrees.

Figure 3B:
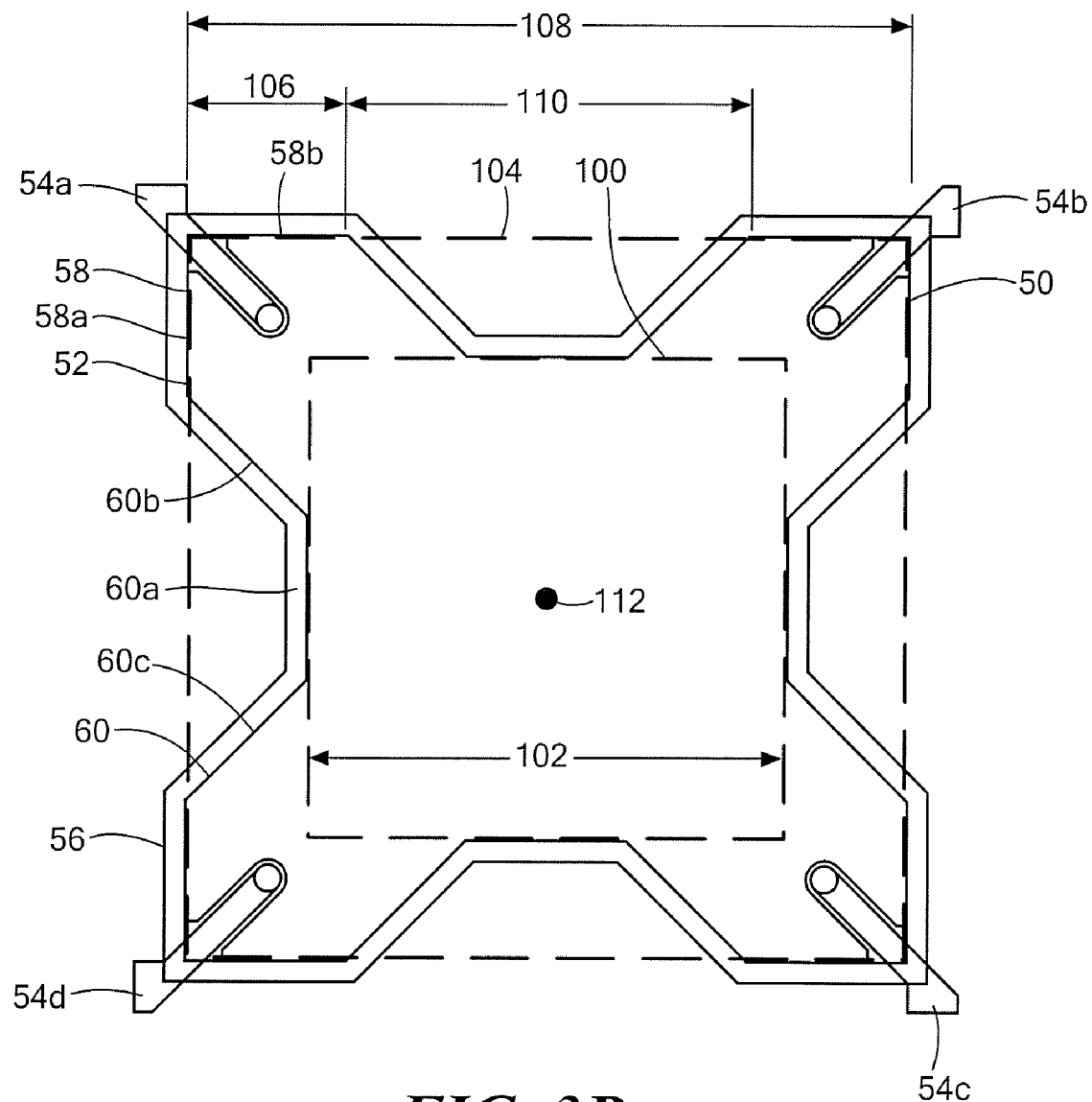
FIG. 3B is top view of the Hall effect element of FIG. 3 showing still other particular features.

Referring now to FIG. 3B, in which like elements of FIGS. 3 and 3A are shown having like reference designations, the Hall effect element 50 (or more precisely, the Hall plate, i.e., epi region, of the Hall effect element 50 for reasons described above in conjunction with FIG. 3) has a square core region 100 entirely within a major planar surface of the Hall effect element 50 (i.e., of the Hall plate of the Hall effect element 50). A portion, e.g., the first side 60a, of each one of the four indented regions, e.g., the indented region 60, is tangential to a respective side of the square core region 100. Returning briefly to FIG. 3A, if the indented regions had the V-shape of the indented region 68, the vertex 70 would be tangential to a respective side of the square core region.

Returning again to FIG. 3B, the four corner regions, e.g., the corner region 58, each have two sides, e.g., 58a, 58b tangential to and, in some embodiments, parallel to, a respective two sides of a square outer boundary 104 associated with the Hall effect element 50 (i.e., the Hall plate of the Hall effect element 50), which has sides with a length 108. Each side of each corner region extends along a respective side of the square outer boundary 104 by a corner extent 106. Furthermore, each one of the indented regions, e.g., the indented region 60, extends along a side of the square outer boundary 104 by an indented extent 110.

Figure 1:
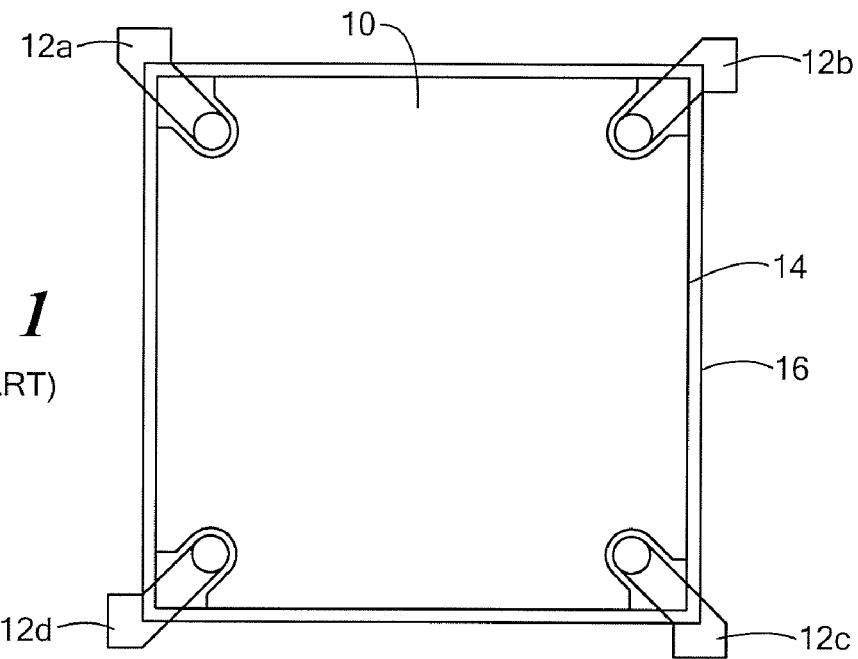
FIG. 1 is top view of a conventional square Hall effect element.
Figure 2:
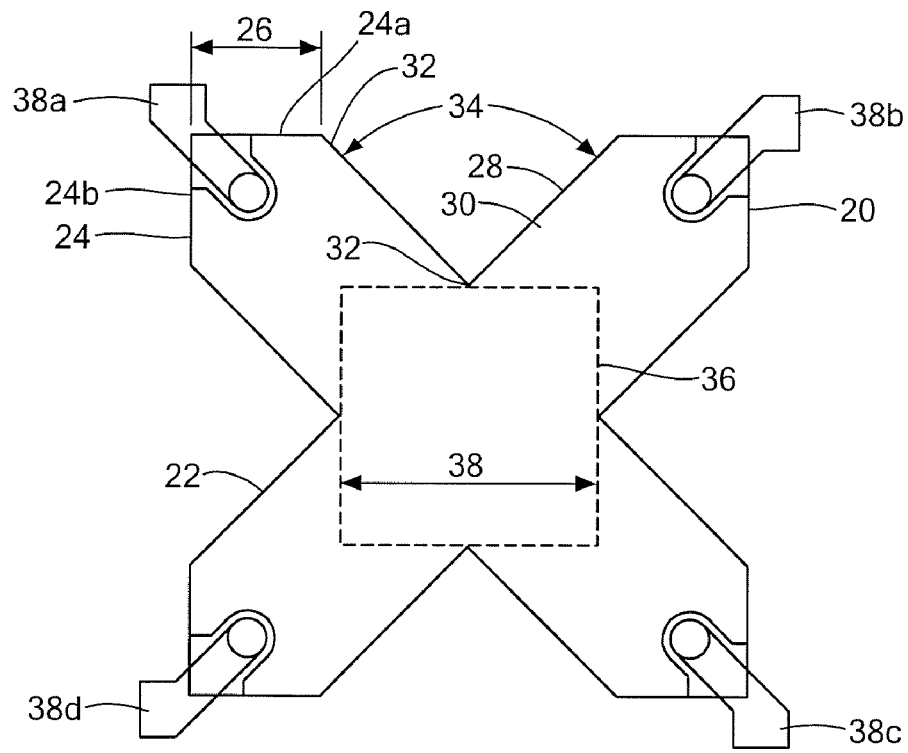
FIG. 2 is top view of a conventional cross-shaped Hall effect element.

Each side of the square core region 102 has a length greater than twice the corner extent 106 and less than the length 108 of each side of the square outer boundary 104. It will be recognized from the above discussion in conjunction with FIG. 2 that if the lengths of the sides of the square core region 100 were exactly twice the length 106 of the corner extent 106, then a conventional cross-shaped Hall effect element 20 (FIG. 2) would result. It will also be recognized that if the lengths of the sides of the square core region 100 were exactly the same as the lengths 108 of the sides of the square outer boundary 104, then there would be no indented regions and a conventional square Hall effect element 10 (FIG. 1) would result. The Hall effect element 50 (i.e., the Hall plate of the Hall effect element 50) has a perimeter with a shape between that of a cross and a square.

In some embodiments, each side of the square core region 100 has a length greater than 2.1 times the corner extent 106 and less 0.95 times length 108 of each side of the square outer boundary 104.

The shape of the perimeter 52 of the Hall effect element 50 results in a smaller area than a square Hall effect element, while retaining good sensitivity and low resistance like a square Hall effect element.

In some embodiments, each side of the square core region 100 has a length of about eighty-five percent of the length 108 of each side of the square outer boundary 104. In some particular embodiments, each side of the square outer boundary 104 has a length of about one hundred thirty microns and each side of the square core region 102 has a length of about one hundred ten microns.

Figure 4:
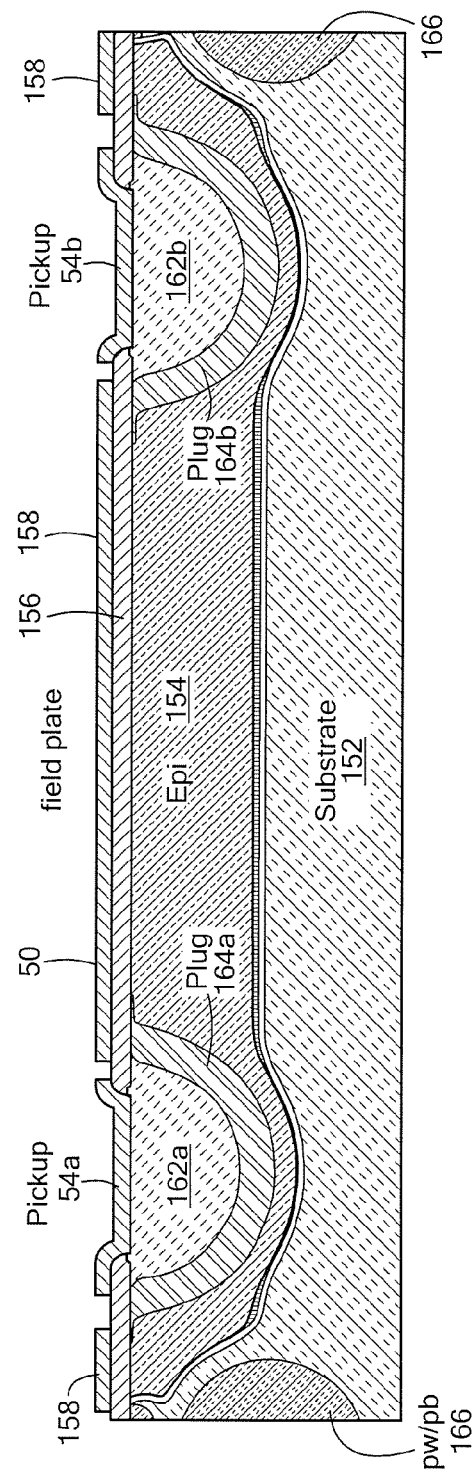
FIG. 4 is a cross-sectional view of the Hall effect element of FIG. 3.
Figure 4:
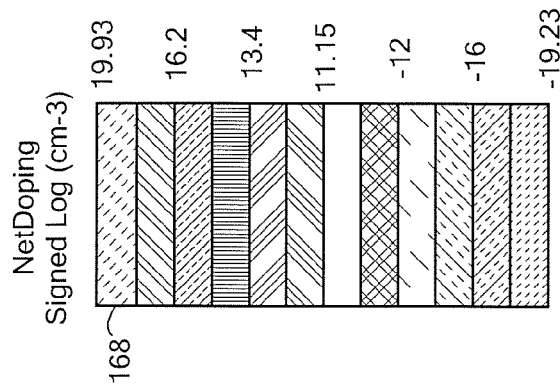

Referring now to FIG. 4, in which like elements of FIGS. 3-3B are shown having like reference designations, a cross section of the Hall effect element 50 is taken along a section line A-A of FIG. 3. A Hall plate 154 (also referred to herein as an epi region) is disposed over a substrate 152, for example, a p-type silicon substrate. As represented in a doping scale 168, the Hall plate 154 can have an n-type doping in a range of approximately $7 \times 10^{15}$ to $1.5 \times 10^{16}$ atoms per $cm^3$, for example, arsenic atoms per $cm^3$.

In some embodiments, an additional n-well implant can be applied to the Hall plate, i.e., to the epi region, with an n-type doping in a range of approximately $7 \times 10^{16}$ to $1.5 \times 10^{17}$ atoms per $cm^3$, for example, phosphorous atoms per $cm^3$. The n-well doping can result in lower plate resistance, but at the sacrifice of some sensitivity to magnetic fields.

A field plate 158 is disposed over the Hall plate 154. An isolation layer 156 is disposed between the Hall plate 154 and the field plate 158.

As described above, it is primarily the Hall plate 154 that has the perimeter 52 having the various shape features described above in conjunction with FIGS. 3-3B. However, the field plate 158 can also have the perimeter 52 with the same shape as the perimeter 52 of the Hall plate 154.

The Hall effect element can be electrically isolated by a p-type well 166 extending all around the Hall effect element 50. The p-type well 166 can have a p-type doping in a range of approximately $7 \times 10^{14}$ to $1.5 \times 10^{15}$ atoms per cm$^3$, for example, boron atoms per cm$^3$ The Hall effect element 50 can include the electrical contacts 54a, 54b, and also two other electrical contacts not visible in this cross section. Under each of the electrical contacts 54a, 54b is a respective plug region formed by a respective n-type doping region 162a, 162b, disposed over another respective n-type doping region 164a, 164b. It should be understood that multiple contacts may also be used in place of the single contact shown here. Such multiple contacts will depend on the exact details of the semiconductor process used to fabricate the Hall effect element 50.

In some embodiments the substrate 152 is comprised of silicon and in other embodiments, the substrate 152 is comprised of gallium arsenide. For embodiments in which the substrate 152 is comprised of gallium arsenide, there may be small structural differences in the layered structure of the Hall effect element, which will be understood by those of ordinary skill in the art. However, a similar Hall effect element can be fabricated using a variety of substrate materials, including, but not limited to, Si, SiGe, GaAs, InGaAs, and AlInGaAs.

All references cited herein are hereby incorporated herein by reference in their entirety.

Having described preferred embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A Hall effect element, comprising:
    a Hall plate comprised of epi material, wherein the Hall plate comprises:
        a major planar surface comprising an outer perimeter, wherein the outer perimeter comprises:
            four corner regions, each having two sides tangential to two respective sides of a square outer boundary associated with the Hall plate, each extending along two sides of the square outer boundary by a corner extent; and
            four indented regions proximate to the four corner regions, wherein each one of the four indented regions deviates inward toward a center of the Hall plate; and
        a square core region centered with and smaller than the square outer boundary associated with the Hall plate, wherein the square core region is entirely within the major planar surface of the Hall plate, and wherein a portion of each one of the four indented regions is tangential to a respective side of the square core region, wherein each side of the square core region has a length greater than twice the corner extent and less than a length of each side of the square outer boundary.

2. The Hall effect element of claim 1, wherein each side of the square core region has a length greater than 2.1 times the corner extent and less 0.95 times length of each side of the square outer boundary.

3. The Hall effect element of claim 2, wherein each one of the four indented regions has two respective intersecting sides forming an obtuse angle having a vertex tangential to a respective side of the square core region.

4. The Hall effect element of claim 2, wherein each one of the four indented regions has a respective first side tangential to and parallel to a respective side of the square core region, and also has respective second and third sides each forming respective obtuse angles with the first side.

5. The Hall effect element of claim 2, wherein each one of the four indented regions extends along a respective side of the square outer boundary by an indented extent, wherein the indented extent is approximately equal to the length of a side of the square outer boundary minus twice the corner extent.

6. The Hall effect element of claim 1, wherein each one of the four indented regions has two respective intersecting sides forming an obtuse angle having a vertex tangential to a respective side of the square core region.

7. The Hall effect element of claim 1, wherein each one of the four indented regions has a respective first side tangential to and parallel to a respective side of the square core region, and also has respective second and third sides each forming respective obtuse angles with the first side.

8. The Hall effect element of claim 1, wherein each one of the four indented regions extends along a respective side of the square outer boundary by an indented extent, wherein the indented extent is approximately equal to the length of a side of the square outer boundary minus twice the corner extent.

9. The Hall effect element of claim 1, further comprising four electrical contacts disposed proximate to the four corner regions, respectively, and within the square outer boundary.

10. The Hall effect element of claim 9, further comprising four doped plug regions, each disposed under a respective one of the four electrical contacts, wherein each one of the four electrical contacts is in electrical communication with a respective one of the four plug regions.

11. The Hall effect element of claim 1, further comprising a field plate disposed over the Hall plate.

12. The Hall effect element of claim 11, wherein the field plate has a perimeter with substantially the same shape as the perimeter of the Hall plate.

13. The Hall effect element of claim 12, wherein the field plate is comprised of a metal.

14. The Hall effect element of claim 12, wherein the field plate is comprised of a polysilicon.

15. The Hall effect element of claim 1, wherein the Hall effect element is disposed over a substrate comprised of silicon.

16. The Hall effect element of claim 1, wherein the Hall effect element is disposed over a substrate comprised of a selected one of Si, GaAs, SiGe, InGaAs, and AlInGaAs.

17. The Hall effect element of claim 1, wherein each side of the square core region has a length of about eighty-five percent of the length of each side of the square outer boundary.

18. The Hall effect element of claim 1, wherein each side of the square outer boundary has a length of about one hundred thirty microns and wherein each side of the square core region has a length of about one hundred ten microns.

19. The Hall effect element of claim 1, wherein the Hall plate comprises an n-well.

\* \* \* \* \*

UNITED STATES PATENT AND TRADEMARK OFFICE
CERTIFICATE OF CORRECTION

| | | |
|---|---|---|
| PATENT NO. | : 7,936,029 B2 | Page 1 of 1 |
| APPLICATION NO. | : 12/388866 | |
| DATED | : May 3, 2011 | |
| INVENTOR(S) | : Yigong Wang | |

It is certified that error appears in the above-identified patent and that said Letters Patent is hereby corrected as shown below:

Column 2, line 9 delete "component" and replace with --components--.

Column 2, line 58 delete "is top" and replace with --is a top--.

Column 2, line 60 delete "is top" and replace with --is a top--.

Column 2, line 62 delete "is top" and replace with --is a top--.

Column 2, line 64 delete "is top" and replace with --is a top--.

Column 2, line 66 delete "is top" and replace with --is a top--.

Column 4, line 42 delete "times length" and replace with --times the length--.

Column 6, line 3 delete "times length" and replace with --times the length--.

Signed and Sealed this
Ninth Day of August, 2011

David J. Kappos
*Director of the United States Patent and Trademark Office*